(12) United States Patent
Inuzuka (10) Patent No.: US 9,929,077 B2
(45) Date of Patent: Mar. 27, 2018

(54) MAGNETIC SENSOR

(71) Applicant: DENSO CORPORATION, Kariya, Aichi-pref. (JP)

(72) Inventor: Yoshinori Inuzuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/616,086

(22) Filed: Jun. 7, 2017

(65) Prior Publication Data

US 2017/0358521 A1 Dec. 14, 2017

(30) Foreign Application Priority Data

Jun. 13, 2016 (JP) ................. 2016-116900

(51) Int. Cl.
*H01L 23/48* (2006.01)
*H01L 23/495* (2006.01)
*H01L 23/00* (2006.01)
*H01L 21/56* (2006.01)

(52) U.S. Cl.
CPC ...... *H01L 23/49541* (2013.01); *H01L 21/565* (2013.01); *H01L 24/49* (2013.01); *H01L 2924/181* (2013.01)

(58) Field of Classification Search
CPC .. H01L 23/49541; H01L 21/565; H01L 24/49
See application file for complete search history.

(56) References Cited

U.S. PATENT DOCUMENTS

| 2004/0113240 | A1 | 6/2004 | Hauser et al. |
| 2006/0185452 | A1* | 8/2006 | Shirasaka ............... G01C 17/28 73/866.5 |
| 2009/0072360 | A1* | 3/2009 | Koga ................ H01L 23/49551 257/669 |

\* cited by examiner

*Primary Examiner* — Nicholas Tobergte
(74) *Attorney, Agent, or Firm* — Nixon & Vanderhye P.C.

(57) ABSTRACT

A magnetic sensor includes a semiconductor element, a lead frame, a bonding wire, and a package. The lead frame includes a die pad to which the semiconductor element is attached and an external connection lead. The bonding wire connects the external connection lead with the semiconductor element. The package seals the semiconductor element, the die pad, the external connection pad, and the bonding wire. The package is made of epoxy-based resin. The lead frame further includes a projecting portion extending from the die pad, the projecting portion is exposed from the package at a position different from a position of the external connection lead, and a partial surface of the projecting portion which contacts with the package is made of material having a higher ionization tendency than an ionization tendency of silver.

4 Claims, 11 Drawing Sheets

MAGNETIC SENSOR

CROSS REFERENCE TO RELATED APPLICATION

This application is based on Japanese Patent Application No. 2016-116900 filed on Jun. 13, 2016, the disclosure of which is incorporated herein by reference.

TECHNICAL FIELD

The present disclosure relates to a magnetic sensor.

BACKGROUND

A manufacturing method of a semiconductor package, e.g., an integrated circuit (IC), a large scale integration (LSI) or the like includes attaching a semiconductor element to a die pad of a lead frame, connecting an electrode portion of the semiconductor element with a pad of an external connection lead of the lead frame via a bonding wire, disposing the lead frame to which the semiconductor element is attached in a molding tool, pouring resin into the molding tool, and sealing the semiconductor element with the resin. Hereinafter, the pad of the external connection lead of the lead frame is also referred to as an external connection pad. The semiconductor package manufactured using the above-described method may include a magnetic sensor that has, e.g., a hall element, a magnetic resistance element or the like.

In a manufacturing of the magnetic sensor, a displacement of the lead frame may occur in the molding tool due to a flow of the resin, and the displacement of the lead frame causes a displacement of the semiconductor element. The displacement of the semiconductor may cause a change of sensor output from an intended output. In US 2004/0113240 A, a projecting portion provided aside from the external connection terminal is sandwiched and supported by the molding tool. This projecting portion prevents a displacement of the lead frame in the molding tool.

SUMMARY

The inventor of the present disclosure found that a crack may occur between a package made of resin and a lead frame in a magnetic sensor described in US 2004/0113240 A. US 2004/0113240 A discloses nothing about the crack which may occur between the package and the lead frame, and also discloses nothing about a solution to the crack occurrence.

In view of the foregoing difficulties, it is an object of present disclosure to provide a magnetic sensor which is capable of restricting a crack occurrence between a package and a lead frame.

After a great deal of study on the crack occurrence in the package, the inventor of the present disclosure has found that the crack occurs from the projecting portion of the lead frame. Usually, silver plating or the like is applied to a main part of the lead frame in order to improve adhesivity between an external connection pad and a bonding wire. It is considered that silver plating applied to the projecting portion may weaken the adhesivity between the package made of epoxy-based resin and the projecting portion. When making the present disclosure, the inventor focused on the above-described point.

According to an aspect of the present disclosure, a magnetic sensor includes a semiconductor element, a lead frame, a bonding wire, and a package. The lead frame includes a die pad to which the semiconductor element is attached and an external connection lead connecting with an external object. The external connection lead has an external connection pad. The bonding wire connects the external connection pad of the external connection lead with the semiconductor element. The package seals the semiconductor element, the die pad, the external connection pad, and the bonding wire. The package is made of epoxy-based resin that contains epoxy resin as a principal component.

The lead frame further includes a projecting portion extending from the die pad, the projecting portion is exposed from the package at a position different from a position of the external connection lead, and a partial surface of the projecting portion which contacts with the package is made of material having a higher ionization tendency than an ionization tendency of silver.

Usually, material having a higher ionization tendency than that of silver is more likely to be oxidized than silver. The epoxy resin which configures the package employs material having a good adhesivity with oxygen. In the above configuration, a partial surface of the projecting portion 31, which contacts with the package 18, has a higher adhesivity with the package compared with other part of the surface to which silver plating is applied. Thus, the above-described magnetic sensor can prevent an occurrence of crack between the projecting portion of the lead frame and the package.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereinafter, respective embodiments will be described with reference to the drawings. In the respective embodiments below, same or equivalent portions are indicated by same reference symbols in the drawings and a same description applies to a portion indicated by the same reference symbol.

First Embodiment

Figures 1, 2:
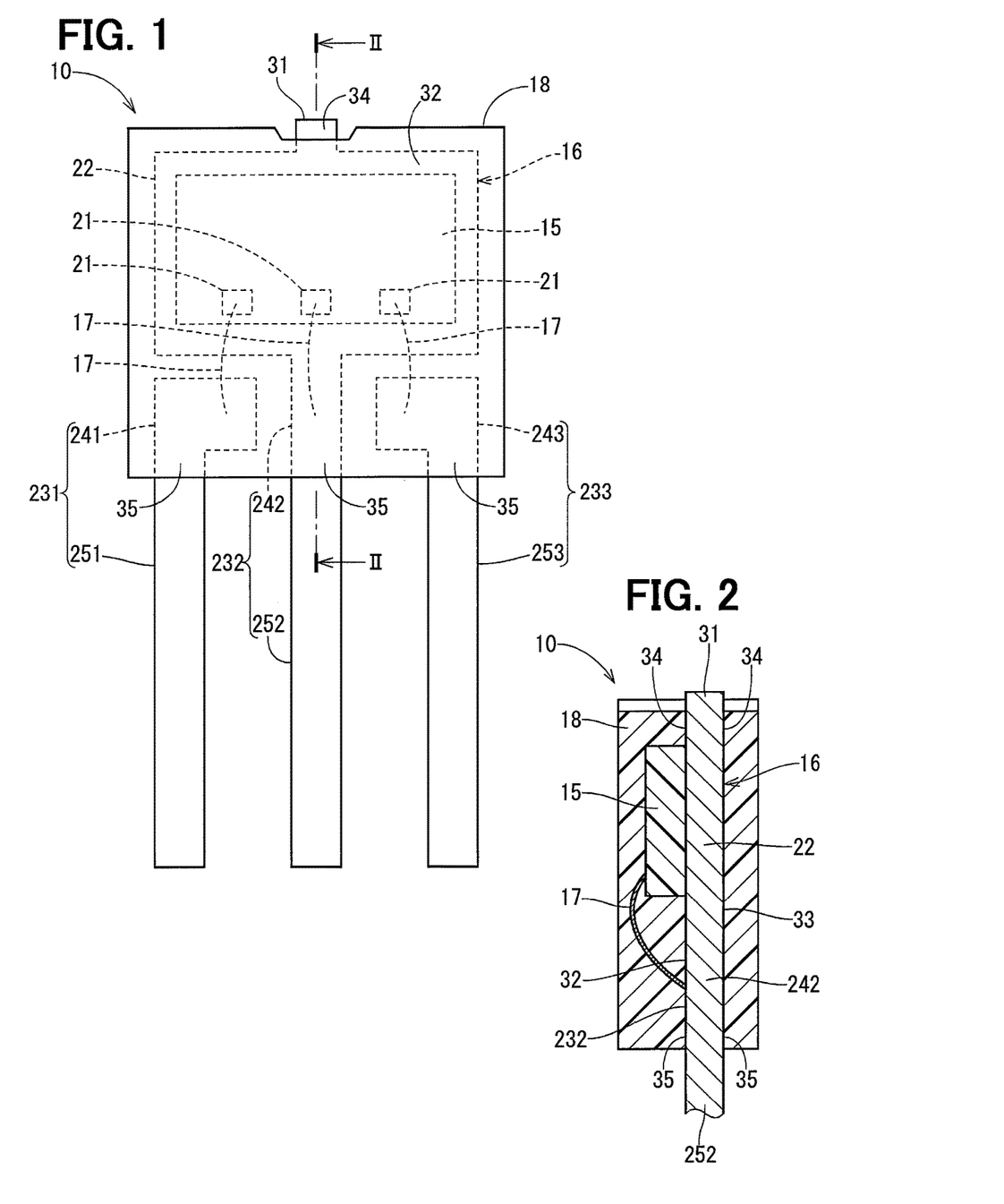
FIG. 1 is a diagram showing an outside view of a magnetic sensor according to a first embodiment of the present disclosure.
FIG. 2 is a diagram showing a cross-sectional view of the magnetic sensor taken along line II-II of FIG. 1.

FIG. 1 shows a magnetic sensor 10 according to a first embodiment of the present disclosure. The magnetic sensor 10 measures a magnitude and a direction of a magnetic field. For example, the magnetic sensor 10 may be used for detecting a rotation angle.

Figure 3:
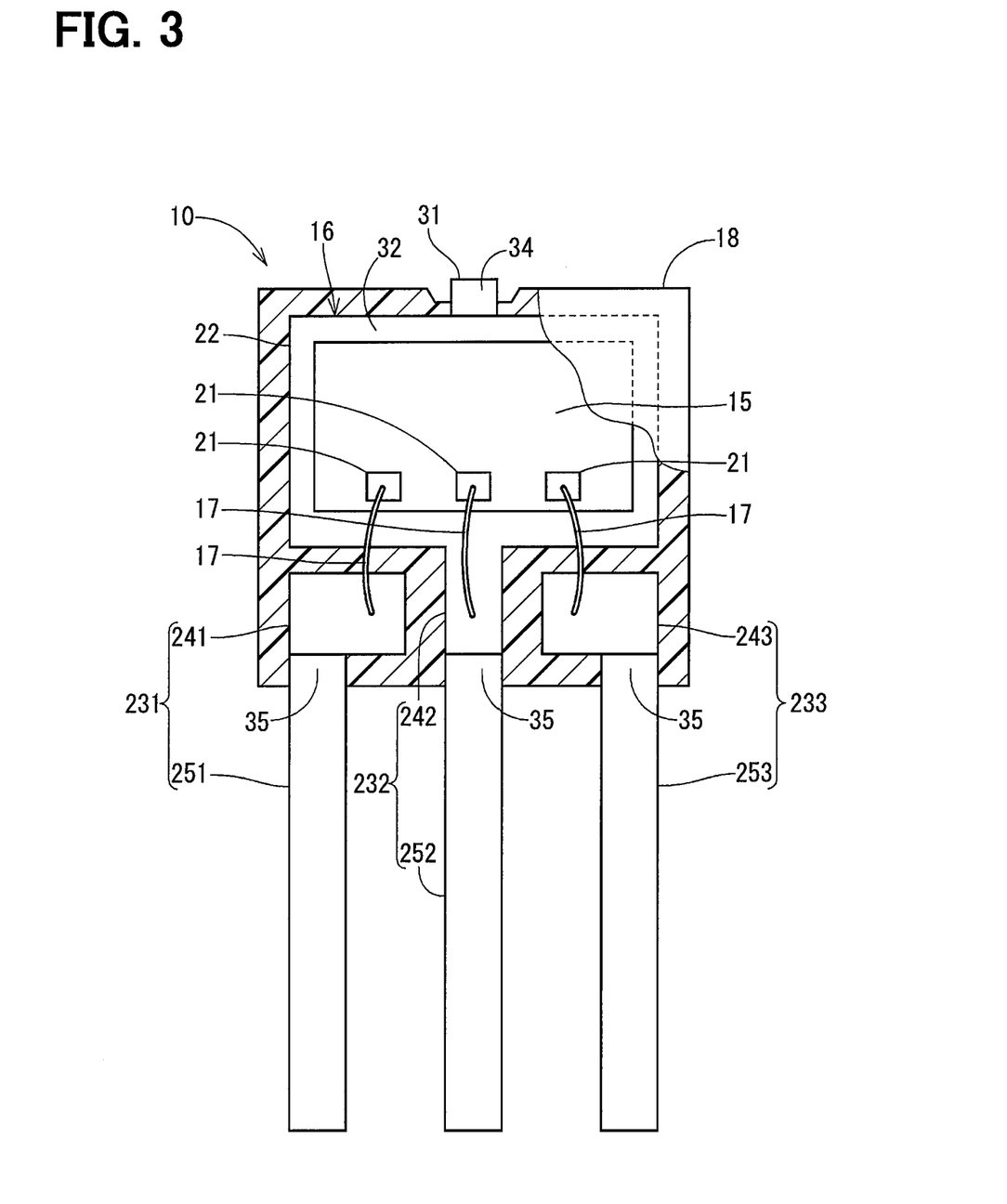
FIG. 3 is a diagram showing a partially cutout isometric view of a package of the magnetic sensor shown in FIG. 1.

The following will describe an overall configuration of the magnetic sensor 10 with reference to FIG. 1 through FIG. 3.

As shown in FIG. 1 through FIG. 3, the magnetic sensor 10 includes a hall element 15, a lead frame 16, bonding wires 17, and a package 18. The hall element 15 corresponds to a semiconductor element in the present disclosure.

The hall element 15 detects a magnetic field based on Hall-effect. The hall element 15 has a surface on which electrode portions 21 are disposed.

The lead frame 16 has a die pad 22 to which the hall element 15 is attached and external connection leads 231, 232, 233 for connecting with external objects. The external connection lead 232 is integrally formed with the die pad 22. The external connection leads 231 and 233 are separated from the die pad 22, and spaced from the die pad 22.

The external connection lead 231 has a pad 241 and a terminal 251. Hereinafter, the pad 241 is also referred to as an external connection pad. The terminal 251 extends from the external connection pad 241.

The external connection lead 232 has an external connection pad 242 and a terminal 252. The terminal 252 extends from the external connection pad 242. The external connection pad 242 is connected with the die pad 22.

The external connection lead 233 has an external connection pad 243 and a terminal 253. The terminal 253 extends from the external connection pad 243.

In the following description, when there is no need to distinguish the external connection leads 231, 232, 233 from one another, the external connection lead 231, 232, 233 is described as an external connection lead 23. Similarly, when there is no need to distinguish the external connection pads 241, 242, 243 from one another, the external connection pad 241, 242, 243 is described as an external connection pad 24. Similarly, when there is no need to distinguish the terminals 251, 252, 253 from one another, the terminal 251, 252, 253 is described as a terminal 25.

The bonding wire 17 is an electrical wire made of metal such as gold, copper, aluminum, or the like. The bonding wire 17 connects the external connection pad 24 with the electrode portion 21 of the hall element 15.

The package 18 is made of epoxy-based resin. The epoxy-based resin contains epoxy resin as principal component. The epoxy-based resin seals the hall element 15, the die pad 22, the external connection pad 24, and the bonding wire 17.

The following will describe a configuration of the magnetic sensor 10 with reference to FIG. 1 through FIG. 9.

As shown in FIG. 1 through FIG. 3, the lead frame 16 further includes a projecting portion 31. The projecting portion 31 extends from the die pad 22, and is exposed outside from one side of the package 18. On another side of the package 18, the external connection lead 23 extends from the die pad 22. More specifically, the projecting portion 31 extends from one side of the die pad 22, and the external connection lead 232 extends from another side of the die pad 22. The projecting portion 31 and the external connection lead 23 are protruded and exposed outside from the package 18 on opposite sides of the package 18.

The die pad 22 and the external connection pad 24 have an integrated front surface 32 on which the hall element 15 is disposed. The die pad 22 and the external connection pad 24 have an integrated back surface 33 that is opposite to the front surface 32. Silver plating is applied to the front surface 32 of the die pad 22 and the external connection pad 24. Silver plating improves adhesivity between the lead frame 16 and the bonding wire 17.

In contrast, copper plating is applied to the back surface 33 of the die pad 22 and the external connection pad 24. Copper platting is also applied to a surface 34 of the projecting portion 31 and a surface 35 of the terminal 25. Thus, in the projecting portion 31 and the terminal 25, a part of the surface which contacts with the package 18 is plated with the material having a higher ionization tendency than that of silver. The material having the higher ionization tendency than that of silver is more likely to be oxidized than silver. The epoxy resin configuring the package 18 has a good adhesivity with oxygen. The projecting portion 31 and the terminal 25 to which the copper plating is applied are more likely to adhere to the package 18 than other portions to which the silver plating is applied.

The following will describe a manufacturing method of the above-described magnetic sensor 10.

Figure 4:
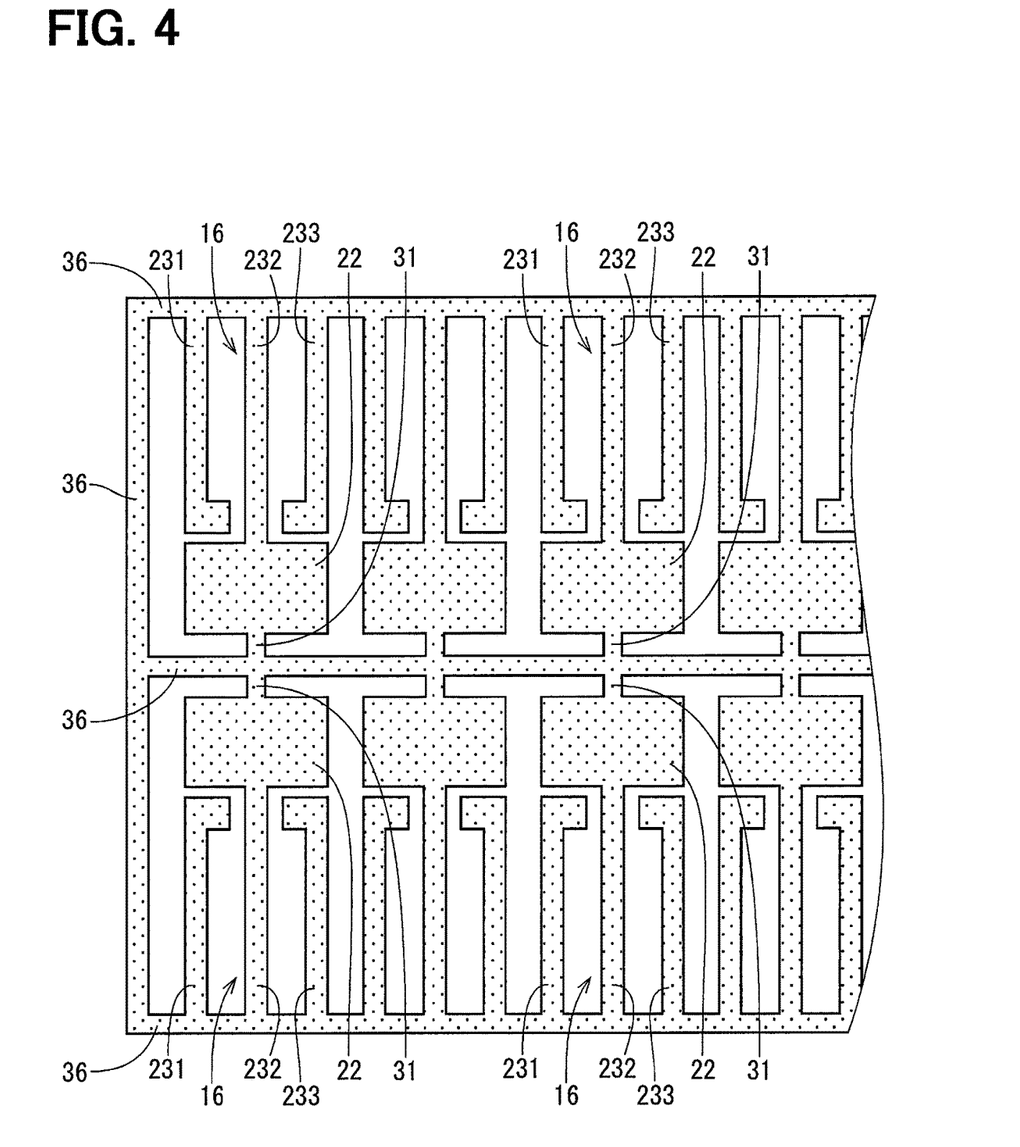
FIG. 4 is a diagram showing generation of lead frames in a manufacturing process of the magnetic sensor shown in FIG. 1.

As shown in FIG. 4, the plural lead frames 16 are manufactured together. The plural lead frames 16 are arranged in line along a direction which intersects with an extension direction of the terminal 25. For example, the plural lead frames 16 may be arranged in line perpendicular to the extension direction of the terminal 25. The lead frames 16 are connected with each other via a connection portion 36. The connection portion 36 has a lattice shape, and is connected with each projecting portion 31 and with each terminal 25.

Figure 5:
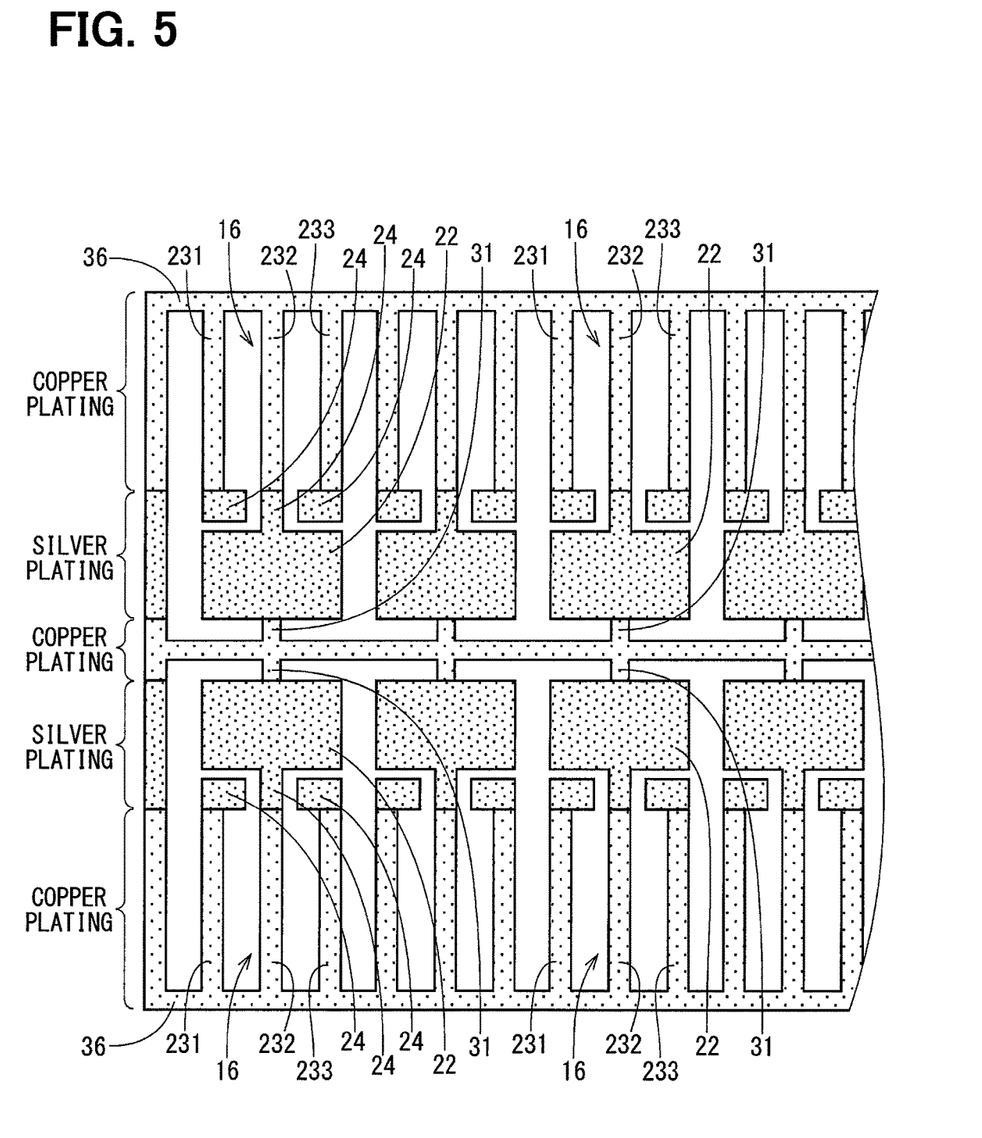
FIG. 5 is a diagram showing application of plating in the manufacturing process of the magnetic sensor shown in FIG. 1.

As shown in FIG. 5, plating is applied to the lead frame 16. First, copper plating is applied to an entire portion of the lead frame 16. Subsequently, silver plating is applied to the front surface 32 of the die pad 22 and the external connection pad 24. In the silver plating, a patterning process is performed linearly along an arrangement direction of the plural lead frames 16.

Figure 6:
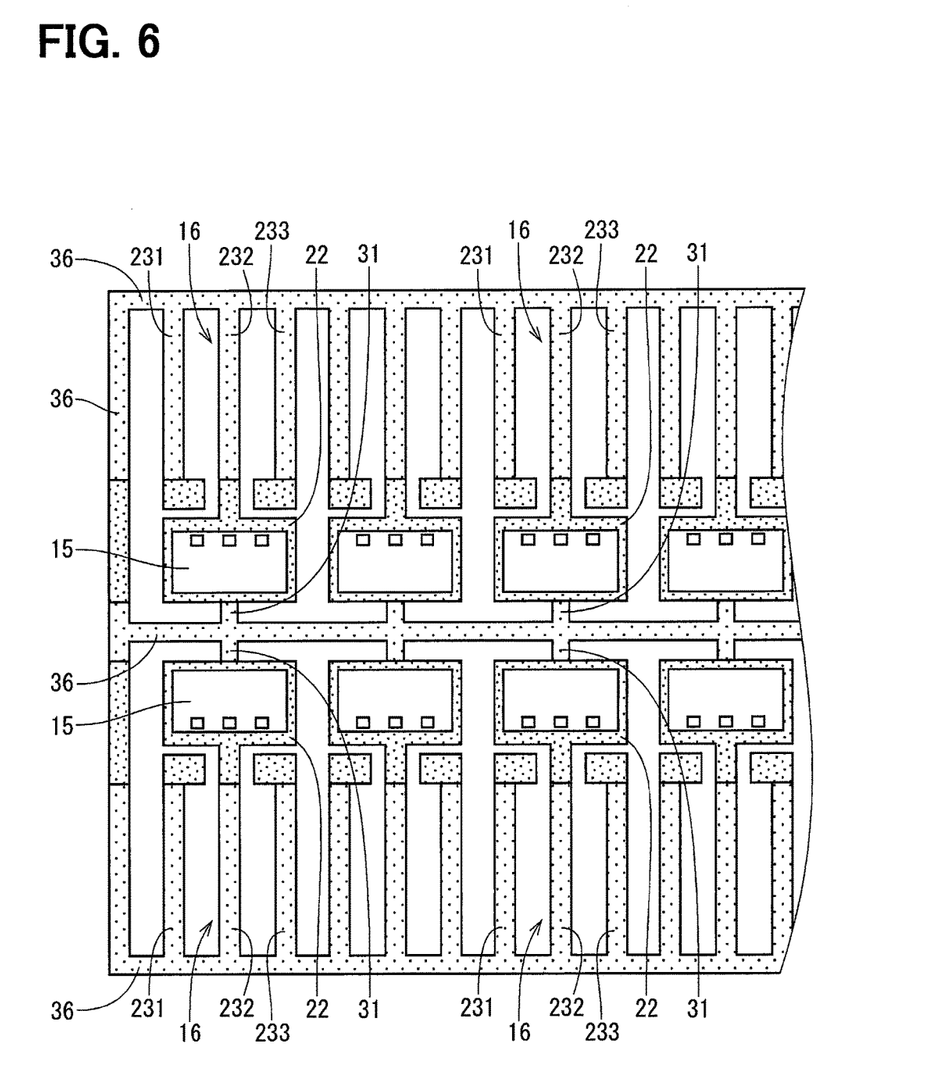
FIG. 6 is a diagram showing die bonding in the manufacturing process of the magnetic sensor shown in FIG. 1.

As shown in FIG. 6, the hall element 15 is attached to the die pad 22.

Figure 7:
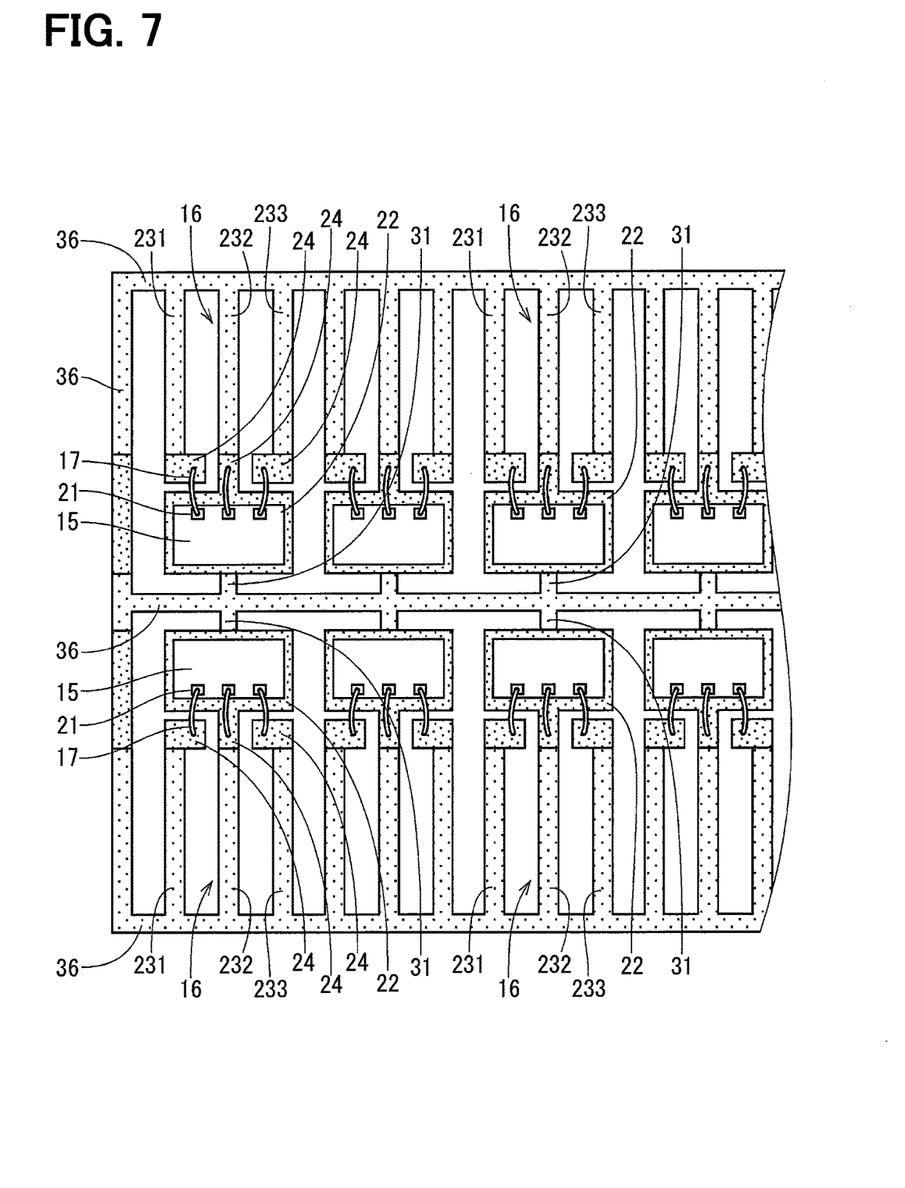
FIG. 7 is a diagram showing wire bonding in the manufacturing process of the magnetic sensor shown in FIG. 1.

As shown in FIG. 7, the external connection pad 24 is connected with the electrode portion 21 of the hall element 15 via the bonding wire 17.

Figure 8:
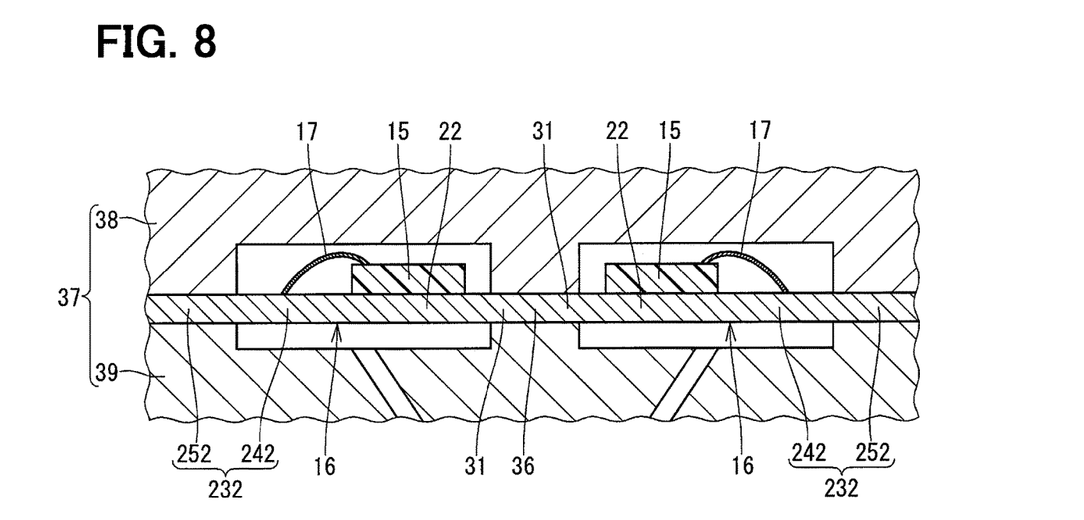
FIG. 8 is a diagram showing a first sealing process in the manufacturing process of the magnetic sensor shown in FIG. 1.
Figure 9:
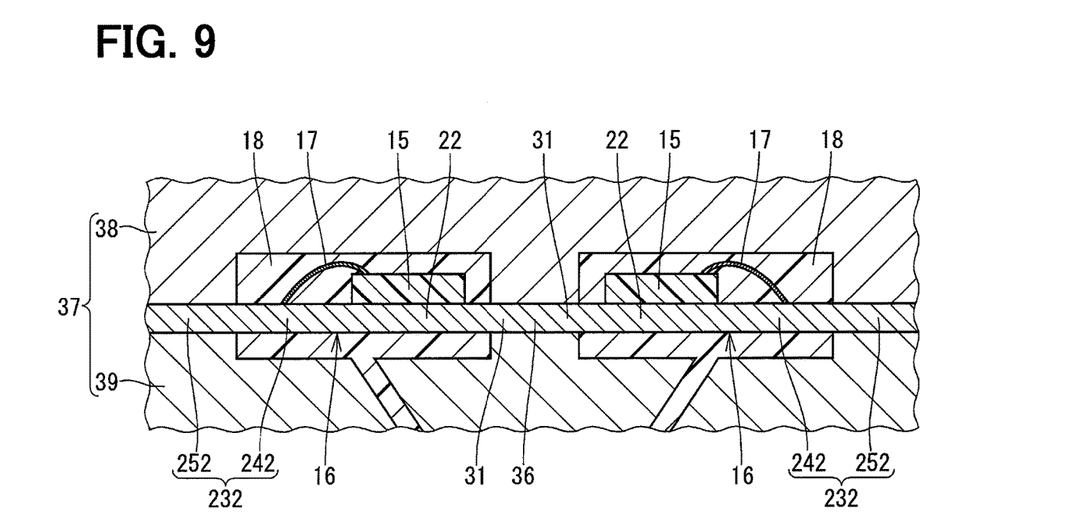
FIG. 9 is a diagram showing a second sealing process in the manufacturing process of the magnetic sensor shown in FIG. 1.

As shown in FIG. 8, the lead frames 16 to which respective hall elements 15 are attached are disposed in a molding tool 37. As shown in FIG. 9, by pouring resin in the molding tool 37, the hall element 15 and other components are sealed by the resin in the molding tool 37. At this time, the projecting portion 31 and the terminal 25 are sandwiched by an upper mold 38 and a lower mold 39 of the molding tool 37. As a result, a displacement of the lead frame 16 is prevented when the resin flows into the molding tool 37.

The projecting portion 31 and the terminal 25 of each lead frame 16 are cut out from the connection portion 36 for separating each magnetic sensor from one another.

The following will describe advantages provided by the above embodiment of the present disclosure.

As described above, in the first embodiment, the package 18 is made of the epoxy-based resin which contains the epoxy resin as the principal component. The lead frame 16 has the projecting portion 31. The projecting portion 31 extends from the die pad 22, and is exposed from one side of the package 18. On another side of the package 18, the external connection lead 23 is exposed outside. A partial surface of the projecting portion 31 which contacts with the package 18 is plated by the material having the higher ionization tendency than that of silver. That is, the copper plating layer is disposed on the partial surface of the projecting portion 31 which contacts with the package 18. The material having the higher ionization tendency than that of silver may include copper or the like.

The material having the higher ionization tendency than that of silver is more likely to be oxidized than silver. The epoxy resin which configures the package 18 has a good adhesivity with oxygen. Thus, the partial surface of the projecting portion 31 which contacts with the package 18 is more likely to adhere with oxygen than other part of the surface to which silver plating is applied. This configuration can prevent a crack occurrence between the package 18 and the projecting portion 31 of the lead frame 16. Usually, a crack between the package 18 and the lead frame 16 causes a change in stress applied to the hall element 15. In the first embodiment, since a fluctuation of the stress applied to the hall element 15 is avoided by preventing the crack occurrence, an output characteristic of the sensor can be secured without changing over time.

In the first embodiment, the projecting portion 31 is exposed from the package 18 on opposite side of the external connection lead 23. As shown in FIG. 5, the plural lead frames 16 are arranged in line along the direction which intersects with the extension direction of each terminal 25. When silver plating is applied to the front surface of the die pad 22 and the external connection pad 24, the front surface can be linearly patterned along the arrangement direction of the plural lead frames 16. That is, even when the plural lead frames 16 are linearly patterned, the projecting portion 31 can be secured from the silver plating. Thus, the silver plating can be performed in an easy manner.

In the first embodiment, the external connection lead 23 has the external connection pad 24 and the terminal 25, and the terminal 25 extends from the external connection pad 24. The partial surface of the terminal 25 which contacts with the package 18 is plated by the material having the higher ionization tendency than that of silver. That is, the copper plating layer is disposed on the partial surface of the terminal 25 which contacts with the package 18. This configuration can restrict the crack occurrence between the package 18 and the terminal 25 of the lead frame 16.

Second Embodiment

Figure 10:
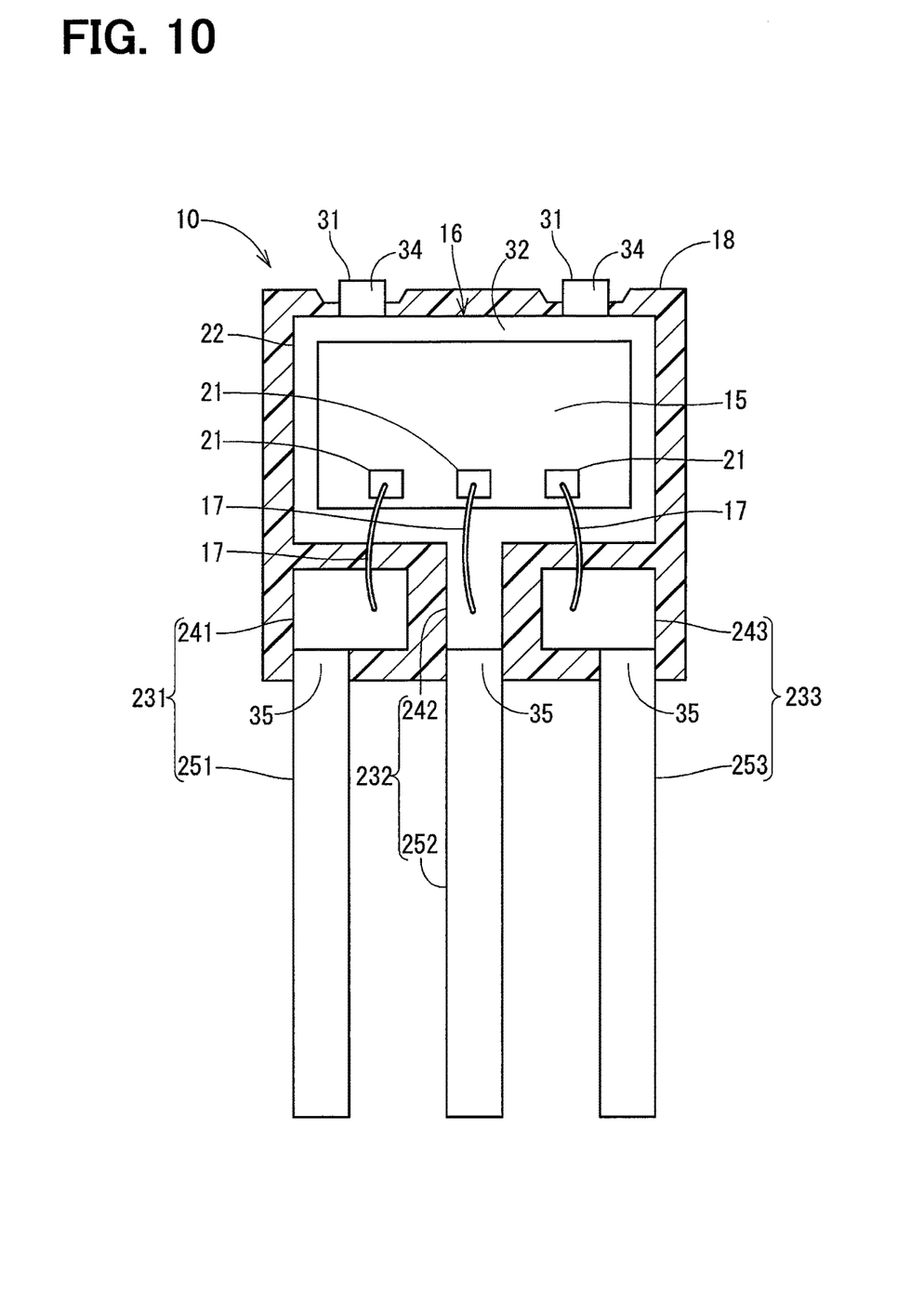
FIG. 10 is a diagram showing a magnetic sensor according to a second embodiment of the present disclosure.

In the second embodiment of the present disclosure, as shown in FIG. 10, the lead frame 16 has two projecting portions 31. The two projecting portions 31 are exposed from the package 18 on opposite side from the external connection lead 23. This configuration can restrict the crack occurrence between the package 18 and the terminal 25 of the lead frame 16 similar to the first embodiment. In addition, in the forming of the package 18, the two projecting portions 31 are sandwiched by the molding tool 37. Thus, the lead frame 16 can be sandwiched by the molding tool 37 more stably.

Other Embodiments

Figure 11:
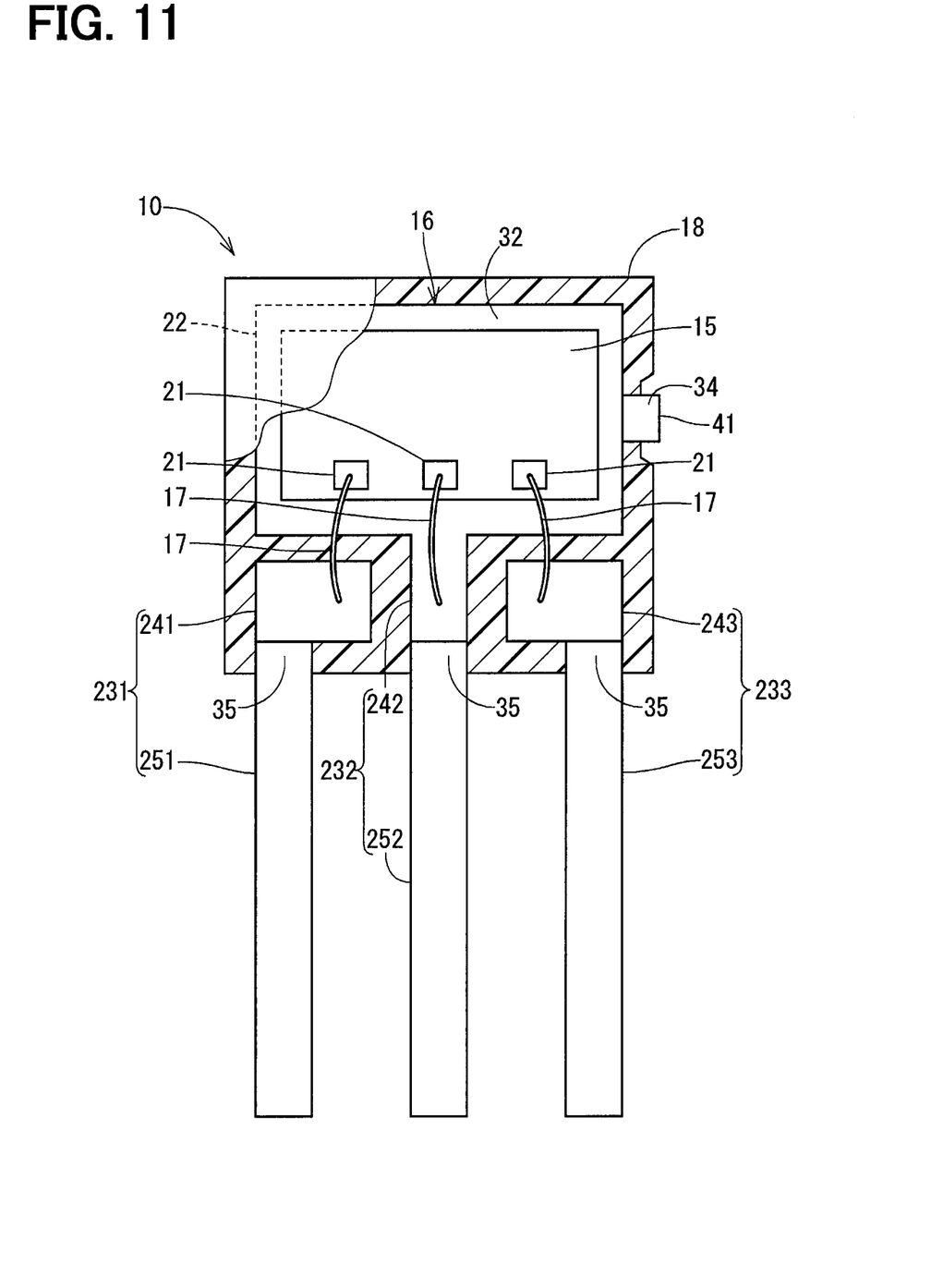
FIG. 11 is a diagram showing a magnetic sensor according to another embodiment of the present disclosure.
Figure 12:
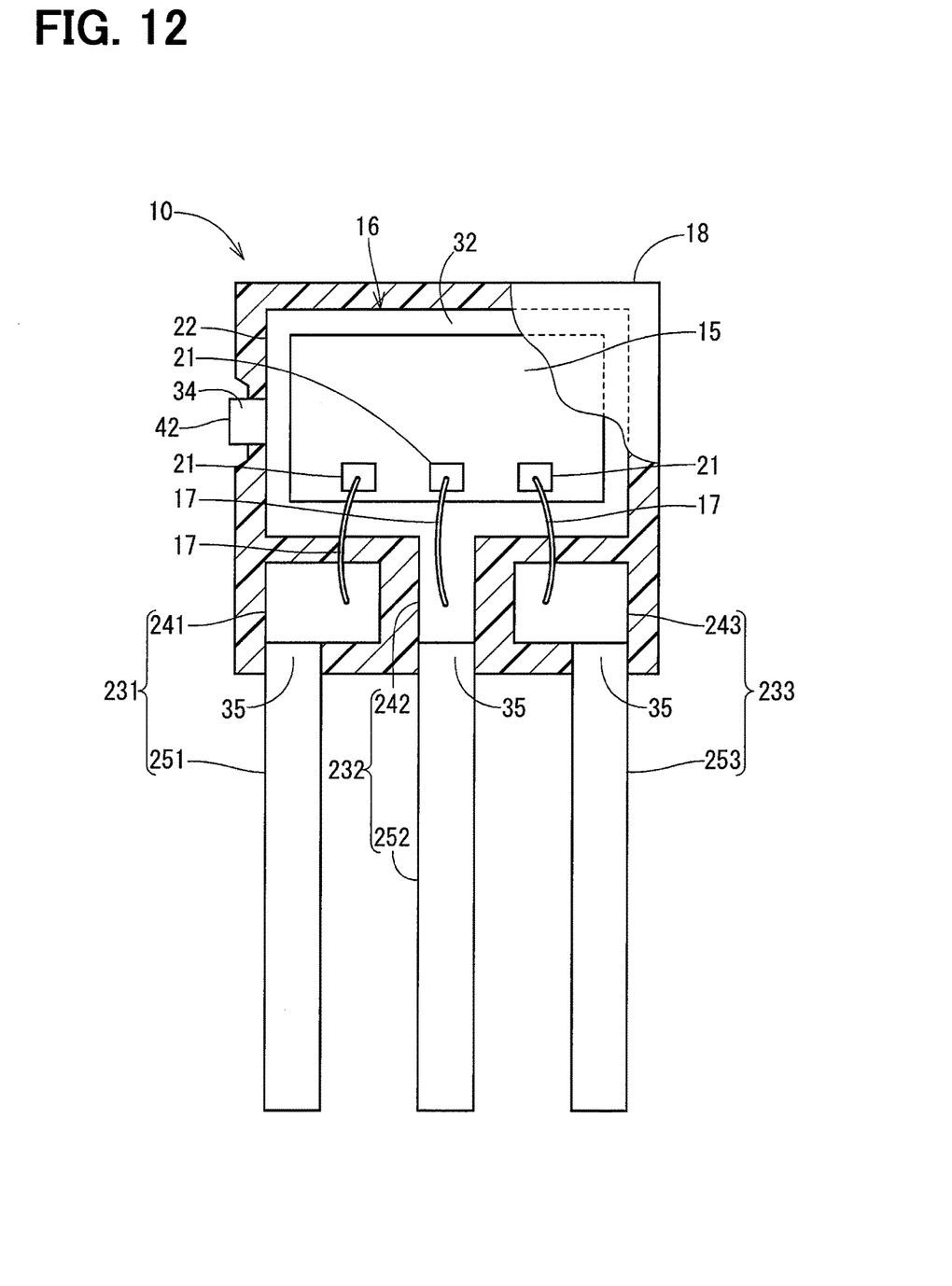
FIG. 12 is a diagram showing a magnetic sensor according to another embodiment of the present disclosure.
Figure 13:
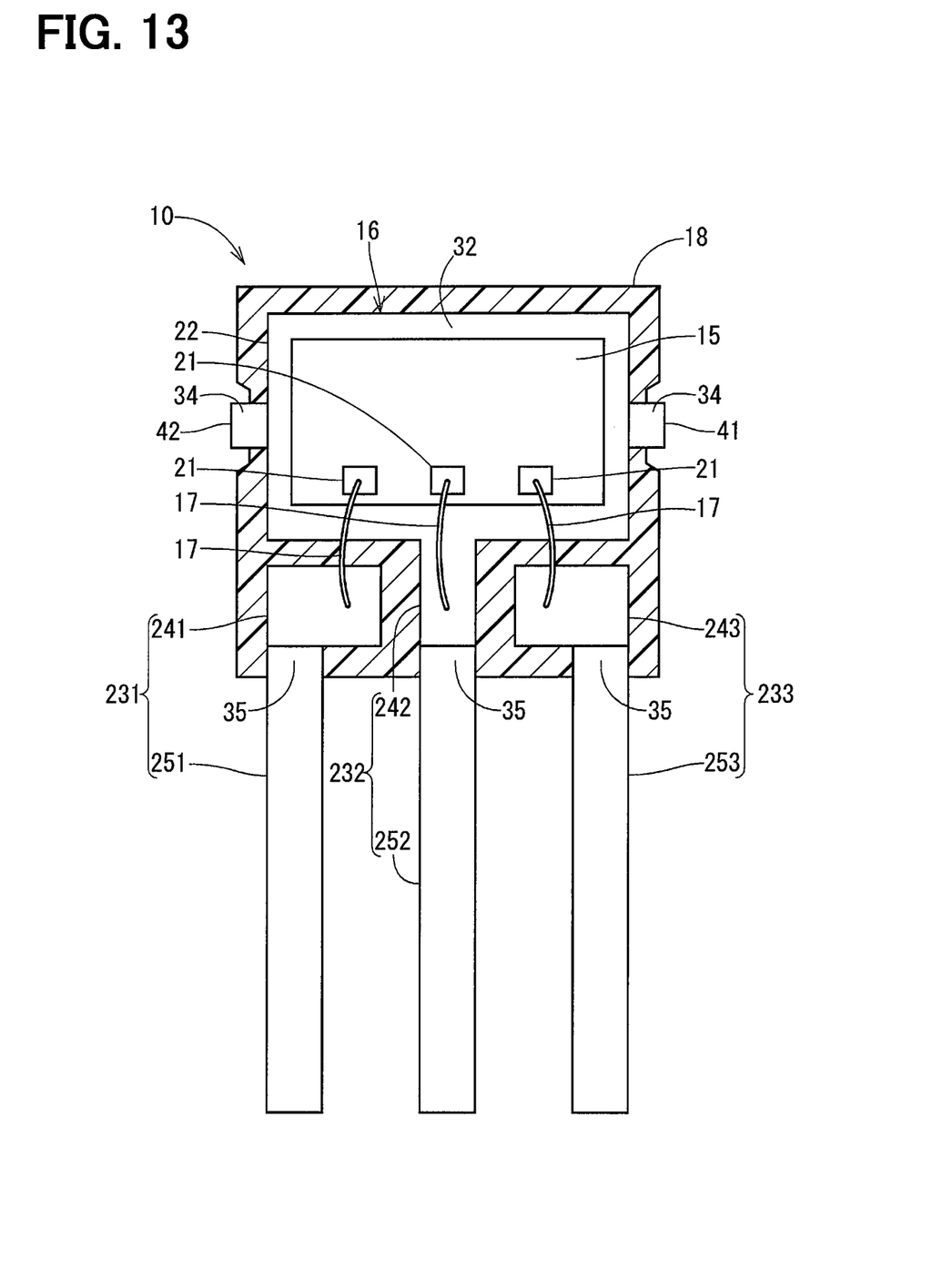
FIG. 13 is a diagram showing a magnetic sensor according to another embodiment of the present disclosure.

The following will describe other embodiments of the present disclosure with reference to FIG. 11 to FIG. 13.

In another embodiment of the present disclosure, as shown in FIG. 11, a projecting portion 41 may extend from one side of the lead frame 16 in a direction intersecting with the extension direction of the terminal 25. In another example, as shown in FIG. 12, a projecting portion 42 may extend from another side of the lead frame 16 in a direction intersecting with the extension direction of the terminal 25. In another example, as shown in FIG. 13, both of the projecting portions 41, 42 may extend from respective sides of the lead frame 16 in opposite directions which intersect with the extension direction of the terminal 25.

In another embodiment of the present disclosure, the number of the projecting portions may be equal to or more than three.

In another embodiment of the present disclosure, the plating applied to the projecting portion and the terminal may employ another material except copper under a condition that the employed material has a higher ionization tendency than that of silver. For example, this kind of metal may include aluminum, nickel, tin, or the like.

In another embodiment of the present disclosure, the projecting portion and the terminal may be made of a material same with the material configuring the plating layer. For example, the silver plating may be applied to a part of the lead frame made of copper, and the surface of the projecting portion and the terminal may be made of copper same as the lead frame. In short, the partial surface of the projecting portion and the terminal both of which contact with the package need to be made of the material having the higher ionization tendency than that of silver.

In another embodiment of the present disclosure, the number of the external connection leads may be one, two, or equal to or more than four.

In another embodiment of the present disclosure, only the surface of the projecting portion may be made of the material having the higher ionization tendency than that of silver instead of configuring both of the surface of the projecting portion and the surface of the terminal by the same material having the higher ionization tendency than that of silver.

The material configuring the surface of the projecting portion may be different from the material configuring the surface of the terminal. For example, copper plating may be applied to the surface of the projecting portion, and aluminum plating may be applied to the partial surface of the projecting portion which contacts with the package.

The magnetic sensor according to the present disclosure may include a different semiconductor element, such as a magnetic resistance element or the like instead of the hall element.

The present disclosure also provides a manufacturing method of the magnetic sensor having the above-described configurations.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A magnetic sensor comprising:
   a semiconductor element;
   a lead frame including a die pad and an external connection lead, wherein the semiconductor element is attached to the die pad, and the external connection lead connects with an external object and includes an external connection pad;
a bonding wire connecting the external connection pad of the external connection lead with the semiconductor element; and
a package sealing the semiconductor element, the die pad, the external connection pad, and the bonding wire, wherein the package is made of epoxy-based resin that contains epoxy resin as a principal component,
the lead frame further includes a projecting portion extending from the die pad,
the projecting portion is exposed from the package at a position different from a position of the external connection lead,
a partial surface of the projecting portion which contacts with the package is made of material having a higher ionization tendency than an ionization tendency of silver,
the lead frame includes a portion with silver, and
a transition from the portion with silver to the material having a higher ionization tendency than the ionization tendency of silver is covered with the epoxy-based resin.

2. The magnetic sensor according to claim 1, wherein the projecting portion and the external connection lead are disposed on opposite sides of the die pad.

3. The magnetic sensor according to claim 1, further comprising
one or more additional projecting portions in addition to the projecting portion.

4. The magnetic sensor according to claim 1, wherein
the external connection lead includes the external connection pad and a terminal extending from the external connection pad, and
a partial surface of the terminal which contacts with the package is made of material having a higher ionization tendency than an ionization tendency of silver.

* * * * *